(12) United States Patent
Benitez et al.

(10) Patent No.: US 8,631,787 B2
(45) Date of Patent: Jan. 21, 2014

(54) MULTI-JUNCTION SOLAR CELLS WITH A HOMOGENIZER SYSTEM AND COUPLED NON-IMAGING LIGHT CONCENTRATOR

(75) Inventors: Pablo Benitez, Madrid (ES); Juan Carlos Minano, Madrid (ES); Maikel Hernandez, Madrid (ES); Jose Blen, Madrid (ES); Ruben Mohedano, Madrid (ES); Oliver Dross, Madrid (ES)

(73) Assignee: Light Prescriptions Innovators, LLC, Altadena, CA (US)

( * ) Notice: Subject to any disclaimer, the term of this patent is extended or adjusted under 35 U.S.C. 154(b) by 1492 days.

(21) Appl. No.: 12/206,547

(22) Filed: Sep. 8, 2008

(65) Prior Publication Data

US 2009/0071467 A1 Mar. 19, 2009

Related U.S. Application Data

(63) Continuation of application No. PCT/US2007/063522, filed on Mar. 7, 2007, and a continuation-in-part of application No. 11/997,142, filed as application No. PCT/US2006/029464 on Jul. 28, 2006.

(60) Provisional application No. 60/776,596, filed on Feb. 24, 2006, provisional application No. 60/703,667, filed on Jul. 28, 2005, provisional application No. 60/780,520, filed on Mar. 8, 2006.

(51) Int. Cl.
*F24J 2/10* (2006.01)

(52) U.S. Cl.
USPC ............................ 126/689; 126/685; 126/683

(58) Field of Classification Search
USPC ......... 126/685, 684, 688, 689, 569, 570, 686, 126/698, 699; 136/246, 259; 359/851, 853
See application file for complete search history.

(56) References Cited

U.S. PATENT DOCUMENTS

| 1,977,689 A | 10/1934 | Muller |
| 2,254,961 A | 9/1941 | Harris |

(Continued)

FOREIGN PATENT DOCUMENTS

| EP | 0450560 A2 | 10/1991 |
| ES | 2142752 | 4/2000 |

(Continued)

OTHER PUBLICATIONS

Minano, Juan C., U.S. Appl. No. 11/997,142, filed Jun. 30, 2008.

(Continued)

*Primary Examiner* — John K Fristoe, Jr.
*Assistant Examiner* — Umashankar Venkatesan
(74) *Attorney, Agent, or Firm* — Drinker Biddle & Reath LLP (57) ABSTRACT

The present embodiments provide methods and systems to homogenize illumination on a target. Some embodiments provide rotational symmetric dual-reflector solar concentrators that include a concave primary reflector with an aim-direction directed toward the sun to receive optical radiation in a far-field angle within an angle of acceptance and redirect radiation upward and centrally generating flux concentration, a secondary reflector positioned coaxial with said primary reflector to receive said redirected radiation and redirect radiation downward and centrally generating flux concentration solar rays, and a central target zone receiving said concentrated solar rays, where cross sections of said primary and secondary reflectors both further comprise a multiplicity of segments that establish a correspondence between pairs of segments, each of said segments of said primary reflector such as to image said angle of acceptance onto said corresponding segment of said secondary reflector to image onto said target zone.

27 Claims, 9 Drawing Sheets

(56) References Cited

U.S. PATENT DOCUMENTS

| | | | |
|---|---|---|---|
| 2,908,197 A | 10/1959 | Wells et al. | |
| 3,171,403 A * | 3/1965 | Drescher | 126/603 |
| 3,746,853 A | 7/1973 | Kosman et al. | |
| 3,988,166 A * | 10/1976 | Beam | 136/246 |
| 4,114,592 A | 9/1978 | Winston | |
| 4,131,485 A * | 12/1978 | Meinel et al. | 136/259 |
| 4,177,083 A * | 12/1979 | Kennedy | 136/259 |
| 4,192,994 A | 3/1980 | Kastner | |
| 4,202,322 A * | 5/1980 | Delgado et al. | 126/574 |
| 4,286,581 A * | 9/1981 | Atkinson, Jr. | 126/585 |
| 4,315,671 A * | 2/1982 | Bunch | 359/741 |
| 4,337,759 A | 7/1982 | Popovich et al. | |
| 4,342,908 A | 8/1982 | Henningsen et al. | |
| 4,347,834 A * | 9/1982 | York | 126/602 |
| 4,350,412 A | 9/1982 | Steenblik et al. | |
| 4,384,769 A | 5/1983 | Brei et al. | |
| 4,464,707 A | 8/1984 | Forrest | |
| 4,638,343 A | 1/1987 | Althaus et al. | |
| 4,683,348 A | 7/1987 | Pidgeon et al. | |
| 4,709,312 A | 11/1987 | Heinisch et al. | |
| 4,727,457 A | 2/1988 | Thillays | |
| 4,868,723 A | 9/1989 | Kobayashi | |
| 4,893,612 A * | 1/1990 | Dawson | 126/689 |
| 5,055,892 A | 10/1991 | Gardner et al. | |
| 5,062,899 A * | 11/1991 | Kruer | 136/259 |
| 5,153,780 A | 10/1992 | Jorgensen et al. | |
| 5,274,497 A * | 12/1993 | Casey | 359/364 |
| 5,335,157 A | 8/1994 | Lyons | |
| 5,343,330 A | 8/1994 | Hoffman et al. | |
| 5,365,920 A * | 11/1994 | Lechner | 126/696 |
| 5,374,317 A * | 12/1994 | Lamb et al. | 136/246 |
| 5,404,869 A | 4/1995 | Parkyn, Jr. et al. | |
| 5,452,190 A | 9/1995 | Priesemuth | |
| 5,453,877 A | 9/1995 | Gerbe et al. | |
| 5,471,371 A | 11/1995 | Koppolu et al. | |
| 5,577,492 A | 11/1996 | Parkyn et al. | |
| 5,600,487 A | 2/1997 | Kiyomoto et al. | |
| 5,613,769 A | 3/1997 | Parkyn et al. | |
| 5,655,832 A | 8/1997 | Pelka et al. | |
| 5,676,453 A | 10/1997 | Parkyn, Jr. et al. | |
| 5,699,186 A | 12/1997 | Richard | |
| 5,757,557 A | 5/1998 | Medvedev | |
| 5,777,433 A | 7/1998 | Lester et al. | |
| 5,806,955 A | 9/1998 | Parkyn, Jr. et al. | |
| 5,813,743 A | 9/1998 | Naka | |
| 5,839,812 A | 11/1998 | Ge et al. | |
| 5,894,195 A | 4/1999 | McDermott | |
| 5,894,196 A | 4/1999 | McDermott | |
| 5,897,201 A | 4/1999 | Simon | |
| 5,898,267 A | 4/1999 | McDermott | |
| 5,924,788 A | 7/1999 | Parkyn | |
| 5,926,320 A | 7/1999 | Parkyn et al. | |
| 5,966,250 A | 10/1999 | Shimizu | |
| 6,030,099 A | 2/2000 | McDermott | |
| 6,044,196 A | 3/2000 | Winston et al. | |
| 6,048,083 A | 4/2000 | McDermott | |
| 6,055,108 A | 4/2000 | Dreyer | |
| 6,097,549 A | 8/2000 | Jenkins et al. | |
| 6,166,860 A | 12/2000 | Medvedev et al. | |
| 6,166,866 A | 12/2000 | Kimura et al. | |
| 6,181,476 B1 | 1/2001 | Medvedev | |
| 6,201,229 B1 | 3/2001 | Tawa et al. | |
| 6,222,623 B1 | 4/2001 | Wetherell | |
| 6,231,197 B1 * | 5/2001 | Nakamura | 359/853 |
| 6,268,963 B1 | 7/2001 | Akiyama | |
| 6,273,596 B1 | 8/2001 | Parkyn | |
| 6,301,064 B1 | 10/2001 | Araki et al. | |
| 6,350,041 B1 | 2/2002 | Tarsa et al. | |
| 6,356,700 B1 | 3/2002 | Strobel | |
| 6,483,976 B2 | 11/2002 | Shie et al. | |
| 6,502,964 B1 | 1/2003 | Simon | |
| 6,530,369 B1 * | 3/2003 | Yogev et al. | 126/680 |
| 6,547,400 B1 | 4/2003 | Yokoyama | |
| 6,578,989 B2 | 6/2003 | Osumi et al. | |
| 6,582,103 B1 | 6/2003 | Popovich et al. | |
| 6,603,069 B1 * | 8/2003 | Muhs et al. | 136/246 |
| 6,607,286 B2 | 8/2003 | West et al. | |
| 6,616,287 B2 | 9/2003 | Sekita et al. | |
| 6,637,924 B2 | 10/2003 | Pelka et al. | |
| 6,639,733 B2 | 10/2003 | Minano et al. | |
| 6,646,813 B2 | 11/2003 | Falicoff | |
| 6,647,199 B1 | 11/2003 | Pelka et al. | |
| 6,668,820 B2 * | 12/2003 | Cohen et al. | 126/685 |
| 6,679,621 B2 | 1/2004 | West et al. | |
| 6,688,758 B2 | 2/2004 | Thibault | |
| 6,691,701 B1 * | 2/2004 | Roth | 126/685 |
| 6,729,746 B2 | 5/2004 | Suehiro et al. | |
| 6,773,143 B2 | 8/2004 | Chang | |
| 6,818,818 B2 * | 11/2004 | Bareis | 136/246 |
| 6,846,100 B2 | 1/2005 | Imazeki et al. | |
| 6,882,379 B1 | 4/2005 | Yokoyama et al. | |
| 6,886,962 B2 | 5/2005 | Suehiro | |
| 6,896,381 B2 * | 5/2005 | Benitez et al. | 359/858 |
| 6,924,943 B2 | 8/2005 | Minano et al. | |
| 6,926,435 B2 | 8/2005 | Li | |
| 6,953,265 B2 | 10/2005 | Suehiro et al. | |
| 6,958,868 B1 * | 10/2005 | Pender | 359/742 |
| 6,997,587 B2 | 2/2006 | Albou | |
| 7,006,306 B2 | 2/2006 | Falicoff et al. | |
| 7,021,797 B2 | 4/2006 | Mlnano | |
| 7,042,655 B2 | 5/2006 | Sun | |
| 7,055,519 B2 * | 6/2006 | Litwin | 126/683 |
| 7,144,121 B2 | 12/2006 | Minano et al. | |
| 7,152,985 B2 * | 12/2006 | Benitez et al. | 359/857 |
| 7,181,378 B2 * | 2/2007 | Benitez et al. | 703/2 |
| 7,192,173 B2 | 3/2007 | Vaughnn | |
| 7,347,599 B2 * | 3/2008 | Minano et al. | 362/511 |
| 7,377,671 B2 | 5/2008 | Minano et al. | |
| 7,435,898 B2 * | 10/2008 | Shifman | 136/246 |
| 7,460,985 B2 | 12/2008 | Benitez et al. | |
| 7,473,000 B2 * | 1/2009 | Spencer et al. | 359/613 |
| 7,520,614 B2 | 4/2009 | Joos et al. | |
| 7,638,708 B2 * | 12/2009 | Fork et al. | 136/246 |
| 7,797,939 B2 * | 9/2010 | Green | 60/641.15 |
| 7,851,693 B2 * | 12/2010 | Fork et al. | 136/246 |
| 7,854,224 B2 * | 12/2010 | Yangpichit | 126/683 |
| 7,855,335 B2 * | 12/2010 | Maeda | 136/246 |
| 7,906,722 B2 * | 3/2011 | Fork et al. | 136/246 |
| 8,000,018 B2 * | 8/2011 | Benitez et al. | 359/626 |
| 8,063,300 B2 * | 11/2011 | Horne et al. | 136/246 |
| 8,119,905 B2 * | 2/2012 | Jensen et al. | 136/259 |
| 2002/0034012 A1 | 3/2002 | Santoro et al. | |
| 2002/0062828 A1 * | 5/2002 | Nydahl et al. | 126/658 |
| 2002/0163808 A1 | 11/2002 | West et al. | |
| 2002/0185651 A1 | 12/2002 | Sommers | |
| 2003/0002281 A1 | 1/2003 | Suehiro | |
| 2003/0037814 A1 * | 2/2003 | Cohen et al. | 136/246 |
| 2004/0031517 A1 * | 2/2004 | Bareis | 136/246 |
| 2004/0070855 A1 * | 4/2004 | Benitez et al. | 359/858 |
| 2004/0080938 A1 | 4/2004 | Holman | |
| 2004/0145910 A1 | 7/2004 | Lisowski | |
| 2004/0218390 A1 | 11/2004 | Holman et al. | |
| 2004/0228131 A1 | 11/2004 | Minano et al. | |
| 2004/0246697 A1 | 12/2004 | Yamashita et al. | |
| 2004/0252390 A1 * | 12/2004 | Benitez et al. | 359/858 |
| 2005/0024744 A1 | 2/2005 | Falicoff | |
| 2005/0046977 A1 * | 3/2005 | Shifman | 359/853 |
| 2005/0088758 A1 | 4/2005 | Minano et al. | |
| 2005/0117125 A1 | 6/2005 | Minano et al. | |
| 2005/0129358 A1 | 6/2005 | Minano et al. | |
| 2005/0135095 A1 | 6/2005 | Geissler | |
| 2005/0200812 A1 | 9/2005 | Sakata et al. | |
| 2005/0225988 A1 | 10/2005 | Chavez | |
| 2006/0067078 A1 | 3/2006 | Beeson et al. | |
| 2006/0207650 A1 * | 9/2006 | Winston et al. | 136/259 |
| 2006/0231133 A1 * | 10/2006 | Fork et al. | 136/246 |
| 2007/0036512 A1 | 2/2007 | Winston et al. | |
| 2008/0000516 A1 * | 1/2008 | Shifman | 136/246 |
| 2008/0047605 A1 * | 2/2008 | Benitez et al. | 136/259 |
| 2008/0092879 A1 * | 4/2008 | Minano Dominguez et al. | 126/699 |
| 2008/0316761 A1 * | 12/2008 | Minano et al. | 362/518 |

(56) References Cited

U.S. PATENT DOCUMENTS

| | | | | |
|---|---|---|---|---|
| 2009/0071467 | A1* | 3/2009 | Benitez et al. | 126/685 |
| 2009/0114213 | A1* | 5/2009 | McDonald et al. | 126/689 |
| 2011/0240094 | A1* | 10/2011 | Hoffman | 136/246 |

FOREIGN PATENT DOCUMENTS

| | | |
|---|---|---|
| ES | 2142752 | 12/2000 |
| JP | 50-159746 | 12/1975 |
| JP | 56-151904 | 11/1981 |
| JP | 62-58686 | 3/1987 |
| JP | 05-211343 | 8/1993 |
| JP | 06-342922 | 12/1994 |
| JP | 2006-303494 | 11/2006 |
| RU | 1282051 A1 | 1/1987 |
| WO | WO-9909349 | 2/1999 |
| WO | WO-9913266 | 3/1999 |
| WO | WO-99/15826 | 4/1999 |
| WO | WO-0107828 A1 | 2/2001 |
| WO | WO-03/071352 | 8/2003 |
| WO | WO2007/104028 | 9/2007 |

OTHER PUBLICATIONS

International Search Report, PCT/US2004/003054, WO2004070433A3, mail date Aug. 19, 2004.
Office action from U.S. Appl. No. 10/987,182 dated Jun. 3, 2005.
Notice of Allowance from U.S. Appl. No. 11/040,506 dated Sep. 20, 2007.
Office action from U.S. Appl. No. 11/040,506 dated Apr. 9, 2007.
Interview Summary from U.S. Appl. No. 10/269,479 dated Mar. 18, 2004.
Office Action from U.S. Appl. No. 10/772,088 dated Sep. 27, 2007.
International Search Report and Written Opinion, PCT/US04/24330, mail date Jun. 27, 2006.
Office Action from U.S. Appl. No. 10/901,919 dated Oct. 19, 2007.
Office Action from U.S. Appl. No. 10/851,471 dated Mar. 27, 2006.
PCT International Search Report and Written Opinion of the International Searching Authority from PCTUS0763522 dated Jan. 30, 2008.
International Search Report and Written Opinion of the International Searching Authority for PCT/US07/073530 mailed Mar. 7, 2008
International Preliminary Report on Patentability, PCTUS0438584, mail date Aug. 21, 2006 , 1-4.
International Search Report and Written Opinion, PCT/US2004/38162, mail date Nov. 30, 2005.
International Search Report, PCT/US03/32076, W02004034100, mail date Apr. 20, 2004.
International Search Report, PCT/US03/38024, W004051223, mail date Nov. 10, 2004.
International Search Report, PCT/US04/16313, WO04104925, mail date Mar. 21, 2005.
International Search Report, PCT/US04/24450, WO05012952, mail date Aug. 3, 2005.
International Search Report, PCT/US04/38584, WO2005050710, mail date Jul. 18, 2005.
International Search Report, PCT/US03/38024, WO2004051321, mail date Nov. 10, 2004 Jul. 29, 2004.
International Search Report, PCT/US04/14938, WO04104642, mail date Mar. 1, 2005.
Office Action from U.S. Appl. No. 10/622,874 dated Jun. 3, 2004.
Office action from U.S. Appl. No. 10/461,557 dated Feb. 10, 2005.
Office action from U.S. Appl. No. 10/461,557 dated Nov. 24, 2004.
Office action from U.S. Appl. No. 10/269,479 dated Mar. 29, 2004.
Notice of Allowance from U.S. Appl. No. 10/269,479 dated Mar. 29, 2004.
Notice of Allowance from U.S. Appl. No. 10/622,874 dated Jan. 4, 2005.
Notice of Allowance from U.S. Appl. No. 10/461,557 dated Aug. 8, 2005.
Notice of Allowance from U.S. Appl. No. 10/461,557 dated Jan. 10, 2006.
Office Action from U.S. Appl. No. 10/461,557 dated Aug. 5, 2005.
Office Action from U.S. Appl. No. 10/772,088 dated Apr. 24, 2007.
Interview Summary from U.S. Appl. No. 10/772,088 dated Apr. 5, 2007.
Advisory Action from U.S. Appl. No. 10/772,088 dated Dec. 6, 2006.
Office Action from U.S. Appl. No. 10/772,088 dated Sep. 8, 2006.
Office Action from U.S. Appl. No. 10/772,088 dated Feb. 24, 2006.
Office Action from U.S. Appl. No. 10/772,088 dated Dec. 16, 2005.
Notice of Allowance from U.S. Appl. No. 10/779,259 dated Oct. 10, 2006.
Office action from U.S. Appl. No. 10/779,259 dated Feb. 24, 2006.
Office action from U.S. Appl. No. 10/779,259 dated Oct. 6, 2005.
Notice of Allowance from U.S. Appl. No. 10/903,925 dated Aug. 5, 2005.
Office action from U.S. Appl. No. 10/903,925 dated Jan. 25, 2005.
Office action from U.S. Appl. No. 10/901,919 dated May 8, 2007.
Notice of Allowance from U.S. Appl. No. 10/880,386 dated Jul. 14, 2006.
Non-Final Office Action from U.S. Appl. No. 11/997,142 mailed Apr. 6, 2010.
Notice of Allowance for U.S. Appl. No. 12/119,039 mailed Dec. 19, 2008.
Final Office Action for U.S. Appl. No. 11/997,142 mailed Jan. 27, 2011
Restriction Requirement for U.S. Appl. No. 11/997,142 mailed Oct. 28, 2010.
Office action from U.S. Appl. No. 10/880,386 dated Feb. 28, 2006.
Notice of Allowance from U.S. Appl. No. 10/880,386 dated Mar. 1, 2005.
Notice of Allowance from U.S. Appl. No. 10/987,182 dated Apr. 25, 2006.
Office action from U.S. Appl. No. 10/987,182 dated Nov. 3, 2005.
"Hyper ARGUS LED, Hyper-Bright 3mm LED, Non Diffused", *Infineon Technologies* Mar. 1, 2000 , 1-9.
Benitez, P. , "Chapter 6: The SMS Design Method in Three Dimensions", *Conceptos avanzados de optica anidolica: diseno y fabricacion, PhD dissertation*, UPM (1998).
Benitez, P. , "Design in 3D Geometry with the Simultaneous Multiple Surface design method of Nonimaging Optics", *Instituto de Engergia Solar, E.T.S.I. Telecommunicacion, Universidad Politecnica*, 28040. Madrid, spin Jul. 26, 2004.
European Search Report, , Supplementary European Search Report from EP04752067 mailed May 9, 2008.
Eurpean Patent Office, , European Search Report dated May 19, 2008 (replacement of May 9, 2008 Search Report).
Glaeser, Georg , "Reflections on Refraction", *AMS* Sep. 5, 2001 , 1-18.
Parkyn, , "The Black Hole: Cuspated waveguide-injectors and illuminators for LEDs", *Part of the SPIE Conference on Nonimaging Optics: Maximum Efficiency Light Transfer V*, Denver, CO Jul. 1999.
Remillard, et al., "Loss Mechanisms Optical Light Pipes", *Applied Optics*, vol. 31 #34 Dec. 1992 , 7232-7241.
Spigulis, , "Compact Dielectric reflective elements, Half Sphere concentrators of radially emitted light", *Applied Optics* vol. 33 Nov. 25, 1994.
Examiner Interview for U.S. Appl. No. 10/901,919 mailed Jan. 23, 2008.
Notice of Allowance for U.S. Appl. No. 10/901,919 mailed Jun. 16, 2008.
Winston, Roland et al., "NonImaging Optics", *Elsevier Academic Press*, Burlington, MA, USA, Copyright 2005.

\* cited by examiner

MULTI-JUNCTION SOLAR CELLS WITH A HOMOGENIZER SYSTEM AND COUPLED NON-IMAGING LIGHT CONCENTRATOR

PRIORITY CLAIM

This application is a continuation of International Application No. PCT/US2007/063522, filed Mar. 7, 2007 and entitled "MULTI-JUNCTION SOLAR CELLS WITH A HOMOGENIZER SYSTEM AND COPULED NON-IMAGING LIGHT CONCENTRATOR", which claims the benefit of U.S. Provisional Application No. 60/780,520, filed Mar. 8, 2006 and entitled "MULTI-JUNCTION SOLAR CELLS WITH A HOMOGENIZER SYSTEM AND COPULED NON-IMAGING LIGHT CONCENTRATOR", each of which is incorporated herein by reference in their entirety; and this application is a continuation-in-part of U.S. patent application Ser. No. 11/997,142, filed Jun. 30, 2008 and entitled "FREE-FORM LENTICULAR OPTICAL ELEMENTS AND THEIR APPLICATION TO CONDENSERS AND HEADLAMPS", which is the National Stage of International Application No. PCT/US2006/029464, filed Jul. 28, 2006 and entitled "FREE-FORM LENTICULAR OPTICAL ELEMENTS AND THEIR APPLICATION TO CONDENSERS AND HEADLAMPS", which claims the benefit of both U.S. Provisional Application No. 60/776,596, filed Feb. 24, 2006 and entitled "FREE-FORM LENTICULAR OPTICAL ELEMENTS", and U.S. Provisional Application No. 60/703,667, filed Jul. 28, 2005 and entitled "FREE-FORM LENTICULAR OPTICAL ELEMENTS AND THEIR APPLICATION TO CONDENSERS AND HEADLAMPS", each of which is hereby incorporated by reference in their entirety.

BACKGROUND OF THE INVENTION

The present invention is concerned with a multi-junction solar cell that employs an optical system to provide extremely high solar flux, resulting in a system that produces very efficient electrical output. More particularly, the invention is directed to a solar energy system that combines a non-imaging light concentrator, or flux booster, with a Kohler homogenizer primary and secondary mirror subsystem, wherein the non-imaging concentrator is efficiently coupled to the mirrors such that uniform irradiance is achieved for high intensity light concentration onto the multi-junction solar cell.

Solar cells for electrical energy production are very well known but have limited utility due to the very high Kwh cost of production. While substantial research has been ongoing for many years, the cost per Kwh still is about ten times that of conventional electric power production. In order to even compete with wind power or other alternative energy sources, the efficiency of production of electricity from solar cells must be drastically improved.

Figure 1:
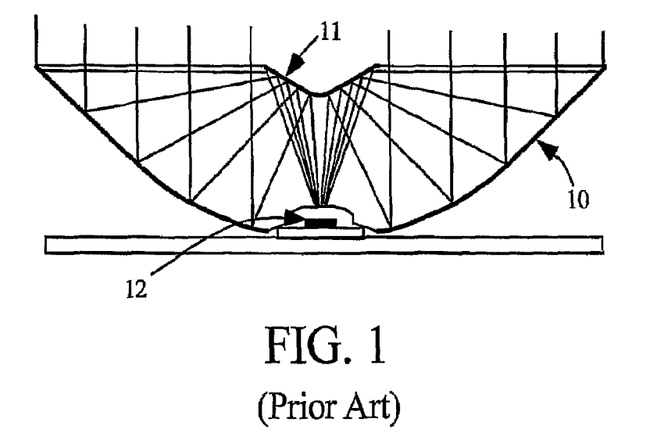
FIG. 1 illustrates the solid-dielectric aplanatic two mirror design disclosed in prior art.

Related prior art is described in (Winston, Gordon, Optics Letters, 2005), which considers a two mirror aplanatic system (which produce sharp imaging of normal-incidence rays on the cell center while satisfying the Abe sine condition) and which may be combined with a non-imaging concentrator. FIG. 1 shows such a two-mirror aplanatic system without the non-imaging concentrator. Primary mirror 10 concentrates the light onto the secondary mirror 11, which illuminates the solar cell 12. This system has a clear limitation in that the illumination on the solar cell it can achieve is highly non-uniform, which reduces the cell efficiency and system reliability. This is because the optics is imaging the plane at infinity onto the plane of the target, where the cell is placed, and thus the sun is imaged on the cell. The angular acceptance of this two-mirror aplanatic concentrator is several times (for example 3) greater than the angular size of the sun to allow for tolerances. The imaging mapping makes the acceptance angle to sun angle ratio the same as the cell diameter to sun image diameter ratio. Therefore, the area of the round target would be $3^2$ times greater than that of the solar image. If the average concentration of the prior art design is 500 suns, the local concentration can reach as much as $3^2 \times 500 = 4,500$ suns. This concentration value cannot be tolerated by present high-efficiency multifunction cells, which show an abrupt drop in efficiency if they operate above 2,000-3,000 suns.

Figure 2:
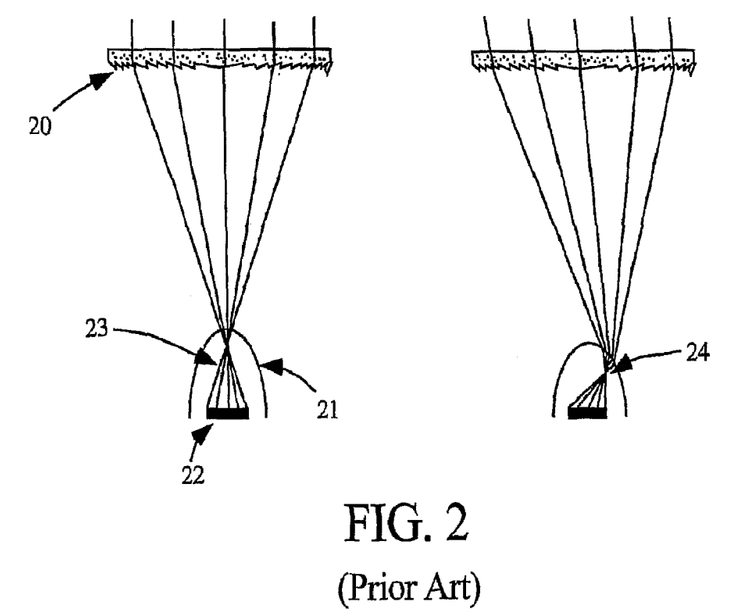
FIG. 2 illustrates the photovoltaic Kohler concentrator disclosed in prior art.

Other related prior art is disclosed in a paper by L. W. James, "Use of imaging refractive secondaries in photovoltaic concentrators", SAND89-7029, Alburquerque, N. Mex., 1989. In that paper, a Kohler integrator system is used as a photovoltaic concentrator (FIG. 2). The Kohler integrator consists of two imaging optical elements (primary and secondary) with positive focal length (that is, producing a real image of an object at infinity). The secondary is placed at the focal plane of the primary, and the secondary images the primary onto the cell. In James' paper, the photovoltaic Kohler concentrator is composed of a Fresnel lens 20 as the primary, and a single-surface imaging lens 21 as the secondary, which encapsulates the cell 22, as illustrated in FIG. 2. The primary images the sun onto secondary aperture 23. As the primary is uniformly illuminated by the sun, the irradiance distribution on the cell is also uniform, and it will remain unchanged when the sun moves within the acceptance angle (equivalently when the sun image 24 moves within the secondary aperture). The concentration-acceptance angle product that can be attained with this configuration is very limited, because the numerical aperture on the cell is small. Additionally, the system cannot be compact because the optic is refractive and uses a single Kohler integration element.

SUMMARY OF THE INVENTION

A two mirror Kohler homogenizer optical design produces an ultra-compact solar concentrator with moderate irradiance non-uniformity. The Kohler optics are combined with a multi-junction solar cell system to create a system that produces electrical output with very high efficiency. In alternative embodiments a plurality of conventional solar cells can be used in place of a multi-junction cell.

A variety of Kohler homogenizer and planar optical systems, formed by two mirrors, can provide the necessary components to deliver light to a multi-junction solar cell. In the Kohler homogenizer, radially symmetric mirror segments on both primary and secondary mirrors are pair-wise correlated so that each segment on the primary images the field of view onto the corresponding secondary segment, while the secondary segment in turn, images the primary segment onto the target. In one embodiment a secondary mirror is co-planar with the entrance aperture, and the exit aperture is co-planar with the vertex of the primary mirror. In a preferred embodiment the inter-mirror space is filled with a dielectric with index of refraction n, such that the numerical aperture ("NA") is increased by a factor of n. A non-imaging light concentrator can be disposed at the exit aperture of the primary mirror wherein the non-imaging concentrator is a $\theta_1/\theta_2$ concentrator, with $\theta_1$ chosen to match the NA of the two-mirror system (sin $\theta_1 = NA/n$) while $\theta_2$ is chosen to satisfy a subsidiary condition, such as maintaining total internal reflection ("TIR") or limiting the angle of irradiance on the multi-junction solar cell.

Objectives and advantages of the invention will become apparent from the following detailed description and drawings described herein below.

DETAILED DESCRIPTION OF THE PREFERRED EMBODIMENTS

This invention makes use of the invention, including embodiments and design methods, described in U.S. Provisional Application No. 60/703,667 titled "Free-Form Lenticular Optical Elements and their Application to Condensers and Headlamps", filed Jul. 28, 2005 by some of the present inventors, which is incorporated herein by reference in its entirety.

Figure 3:
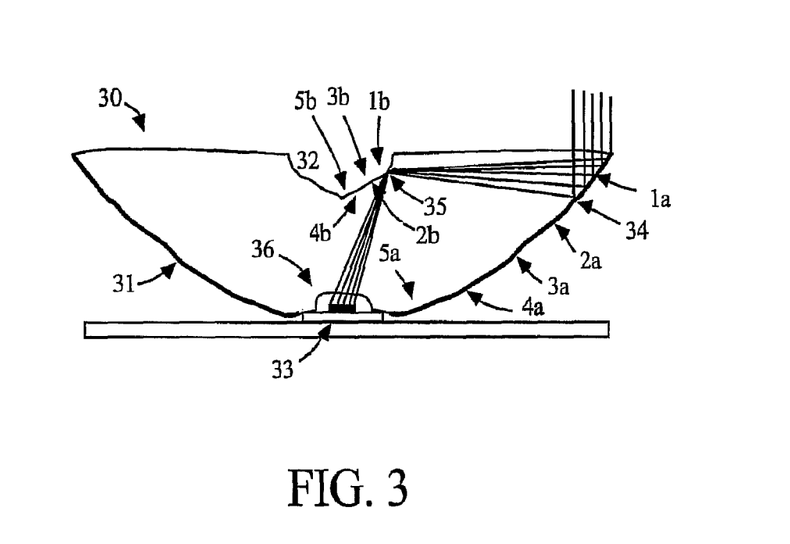
FIG. 3 illustrates a solid dielectric two-mirror Kohler radial homogenizer optical system.

An optical system constructed in accordance with one embodiment of the invention is shown in FIG. 3 as a most preferred embodiment. The entrance aperture 30 and the exit aperture 36 can be flat. Segmented secondary mirror 32 is substantially co-planar with the entrance aperture 30 of a primary mirror 31. The segments on the primary 1a, 2a, etc. are essentially parabolic, each with a focus at the associated mirror segment 1b, 2b, etc. on the secondary and along the vertical axis (not shown). The secondary mirror segments 1b, 2b, etc. are essentially elliptical with foci at the locations of the associated primary mirror segment and the target. There is continuity in profile but discontinuity in slope in both secondary and primary. The target plane of the combination of the primary mirror 31 and the secondary mirror 32 resides at the cell 33.

In this embodiment the edges of a given segment of the secondary mirror 32 are designed so that their images at infinity through the associated primary segment match the design acceptance angle. On the other hand, the edges of a given segment of the primary are designed so that their images on the target through the associated secondary segment match the cell-size. Since the segments on the primary are uniformly illuminated, the illumination on the cell is also uniform in two dimensions.

The mirror segments can also be configured to optimize global performance. For example, the parabola or ellipses focus position and parabola axis could be considered a parameter and a multiparameter optimization program can optimize the acceptance angle of the whole system. Alternatively, the parabola axis could be chosen to coincide with one of the edges of the acceptance angle and its focus placed at one of the edges of the associated secondary mirror, and also the ellipses can have their foci coinciding with the edges of the cell and of the associated primary mirrors.

Figure 4:
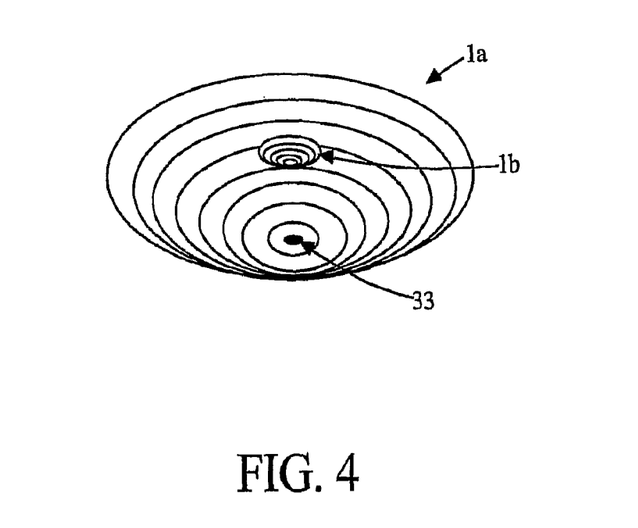
FIG. 4 illustrates a 3D view of the two-mirror Kohler radial homogenizer optical system of FIG. 3.

The actual three-dimensional device is preferably rotationally symmetric, as shown in FIG. 4, so that the segments of primary and secondary mirrors form rings. Since the Kohler integration is only done in the meridional cross-section, no uniformity is gained in the sagittal direction. This means that if the acceptance angle is 3 times the solar disk, the local concentration is only 3 times the average. Therefore, for a 500-sun average concentration the maximum local concentration on the cell is 1,500 (which is acceptable).

Regarding the local concentration produced on the secondary mirror, when the sun is centered on axis, the irradiance pattern on each annular segment of the secondary mirror is a thin ring centered on the segment with about 100-150 suns concentration, which is also acceptable for mirror durability.

Figure 5:
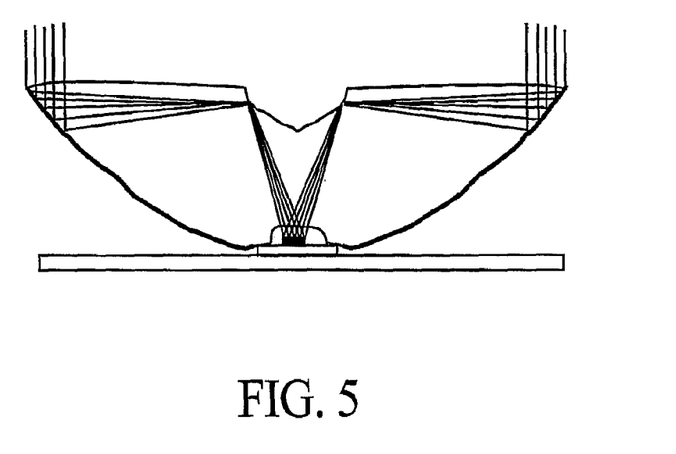
FIG. 5 illustrates the operation of the two-mirror Kohler radial homogenizer optical system when the sun is off-center but still within the design acceptance angle.

If the sun is off-center, but still within the design acceptance angle, the thin irradiance ring on each annular segment of the secondary is displaced; but it is still inside the segment. In the meridional cross-section, the solar images are thus displaced as shown in FIG. 5. The maximum irradiance levels on the secondary and on the cell remain unchanged.

Dispersion due to the variation of the refractive index of the dielectric material used (i.e. glass or acrylic) significantly limits the solar flux concentration with reasonable acceptance angle (>15 mrad half angle) by a well-designed flat Fresnel lens to ≈150 suns. The angular dispersion due to a single refraction is:

$$\frac{\delta\theta}{\tan\theta} = -\frac{\delta n}{n} \quad (1)$$

where n is the relative refractive index at the interface and θ is the refracted angle.

For the concentrator as the invention disclosed in FIG. 3, there are two refractive surfaces: the entry surface 30 and the exit surface 36. In the first one, if the refractive entrance aperture 30 is flat, the incidence angle is limited to the acceptance angle and equation (1) states (approximating the tangent function by its argument) that relative dispersion of the refraction angle equals (in absolute value) to relative dispersion of the refractive index, which is below 1% in most optical dielectrics. In the second refraction, the effect is even smaller since the angular acceptance at that surface is very wide (close to ±90°). It is also smaller because the dispersion of the relative refractive index δn is much smaller (assuming a limited cell illumination angle, up to say ±45°) and because the concentrator dielectric material and the cell encapsulant have a more similar variation with wavelength than that of the dielectric as compared to air of the first refraction).

Therefore, the preferred dielectric optical system in FIG. 3 is for practical purposes achromatic. In fact, Equation (1) indicates some flexibility in design. For example, the dielectric/air interface (the entrance aperture 12) does not have to be strictly normal to the beam. A modest inclination is allowable, just as long as chromatic effects, as determined by Equation (1) are kept reasonably in bounds. If the entrance surface is not flat, the rays should be traced through them in the design. For example, if the segments of the primary are parabolas when the entrance surface is flat, then when it is non-flat, its shape should be calculated so as to enable the impinging parallel rays, after the refraction on the non-flat aperture, to be focused onto the associated secondary. This calculation is called generalized Cartesian Oval, which in general solves the inverse problem of calculating the optical surface (reflective or refractive) that couples the rays normal to two given wavefronts. The same considerations apply to the change of the exit surface from flat. A hemispherical shape, for instance, could also be prescribed.

Figure 6:
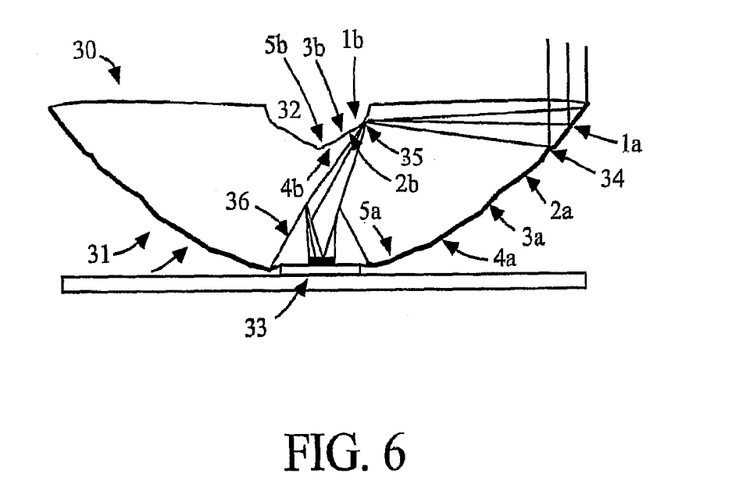
FIG. 6 illustrates a non-imaging concentrator added to the two-mirror Kohler radial homogenizer optical system to increase the concentration ratio of the acceptance angle.

In case an increase in concentration or acceptance angle is desired, it is preferable to add a final-stage nonimaging concentrator, as shown in FIG. 6. This concentrator 60 could be a $\theta_1/\theta_2$ non-imaging concentrator where $\theta_1$ is chosen to match the numerical aperture (NA$_1$) at the exit of the two mirror system where $\sin\theta_1 = NA_1/n$. The value of $\theta_2$ is chosen to satisfy a subsidiary condition, such as maintaining total internal reflection (TIR) on the nonimaging concentrator sides or limiting angles of irradiance onto a multi-junction cell. The concentration or flux boost of the terminal stage approaches the fundamental limit of $(\sin\theta_2/\sin\theta_1)^2$. The overall concentration can approach the etendue limit of $(n/\sin\theta_0)^2$ where $\sin\theta_0 = n\sin\theta_1$. In alternative embodiments, the non-imaging concentrator can be a known tailored non-imaging concentrator or a flow line concentrator.

The planar all-dielectric optical system presented here embodies inexpensive high-performance forms that should be capable of (a) concentrating the solar radiation with acceptable nonuniform irradiance levels, (b) incurring negligible chromatic aberration even at ultra-high concentration, (c) passive cooling of the cell, (d) accommodating liberal optical tolerances, (e) mass production with existing glass and polymeric molding techniques, and (f) high compactness.

Figure 7:
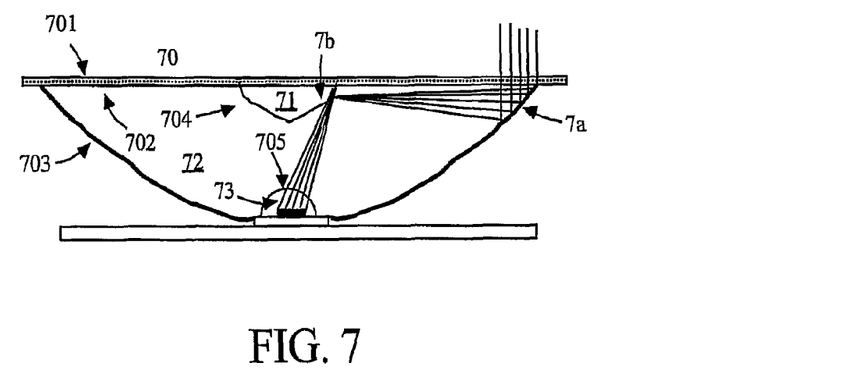
FIG. 7 illustrates a two-mirror Kohler radial homogenizer optical system that may be comprised of volumes of different refractive indices.

FIG. 7 illustrates a two-mirror Kohler radial homogenizer optical system that may be comprised of volumes 70, 71, 72 and 73 of different refractive indices. If 72 is air and 70 and 71 are of the same dielectric material (so interface 702 does not exist), the device in FIG. 7 reduces to that in FIG. 3. The optical design of the device in FIG. 7 is done in substantially the same way as described for the design of FIG. 3.

Another preferred embodiment considers that 71 is air, in which the optical losses due to absorption in that medium are eliminated. In this case, the flat cover 70 prevents dust from accumulating in the system and protects mirrors from the environment. If medium 73 is also air, the cell is not encapsulated, which increases the system optical efficiency since the Fresnel reflection on the interface 705 is eliminated. However, to prevent cell degradation by moisture, it may be preferable to encapsulate the cell within a dielectric dense medium 73, such as silicone rubber. The prescribed surface 705 of the encapsulating dielectric material will be considered in the design as a prescribed surface through which the rays are traced. Additional surfaces may be included as prescribed in the system, and the application of the same design procedure of the invention is straightforward for one of skill in the art. For instance, the encapsulating lens can be made of glass or transparent plastic, and the cell coupled to it with a gel or a silicon rubber. In this case, an additional interface (without a specific optical function) will appear.

Instead of establishing a design of the two mirrors, any other two surfaces of the five surfaces 701, 702, 703, 704 and 705 in FIG. 7 could be designed. Therefore, nine alternative families of devices are illustrated in FIG. 8 through FIG. 16. Other like configurations can be established using combinations and variations by employing the principals of the invention. For all this cases, the design can be generated in 4 steps:
(1) Three of the five surfaces are prescribed,
(2) The remaining two surfaces are calculated in 2D to make the coupling of two parallel input wavefronts defined by the acceptance angle into the two spherical exit wavefronts defined by the target edges. Alternatively, the target and acceptance angle can be scaled down to converge to zero, and then the resulting two surfaces will be aplanatic (i.e., stigmatic and fulfilling the Abbe sine condition). If the calculated surfaces are not manufacturable, a new selection of the three prescribed surfaces in step (1) is done,
(3) Two of the five surfaces are selected,
(4) The two selected surfaces in (3) are recalculated to contain the Kohler-integrator segments as disclosed above, ray tracing through the prescribed or precalculated surfaces.

When the exit surface is to be selected, it is possible to shape it to even improve the uniformity of the Kohler homogenizing device when the sun is on-axis, provided that there is a significant refractive index difference at both sides of the exit surface. FIG. 17 illustrates how this can be accomplished. In order to provide the uniformity improvement, the exit surface profile should have a concavity 171 or a convexity 172 at the center when the cell side 173 has respectively, a higher or lower refractive index These profiles cause rays 174 going to the cell-center to be deflected and strike closer to the cell rim.

Figure 8:
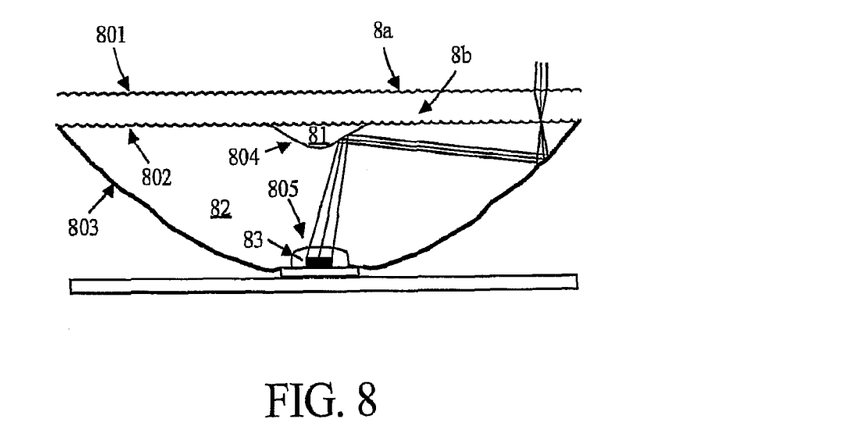
FIG. 8 illustrates a Kohler homogenizer optical system that may be comprised of volumes of different refractive indices and the Kohler homogenization is done between the two surfaces of the front top dielectric cover.

FIG. 8 illustrates a Kohler homogenizer optical system that can be comprised of volumes 80, 81, 82 and 83 of different refractive indices; and the Kohler homogenization is done between the two surfaces 801 and 802 of the front top dielectric cover 80. In one embodiment, the medium 82, is air and the lenses in cover 80 are top-down symmetric. Here the Kohler homogenization can be only in the radial direction. Alternatively, the Kohler homogenization can be done in both the radial and sagittal directions using with rotationally symmetric lens units in the lens array, displaced either in a rectangular or hexagonal pattern. This embodiment would increase further the illumination homogeneity of the lens.

Figure 9:
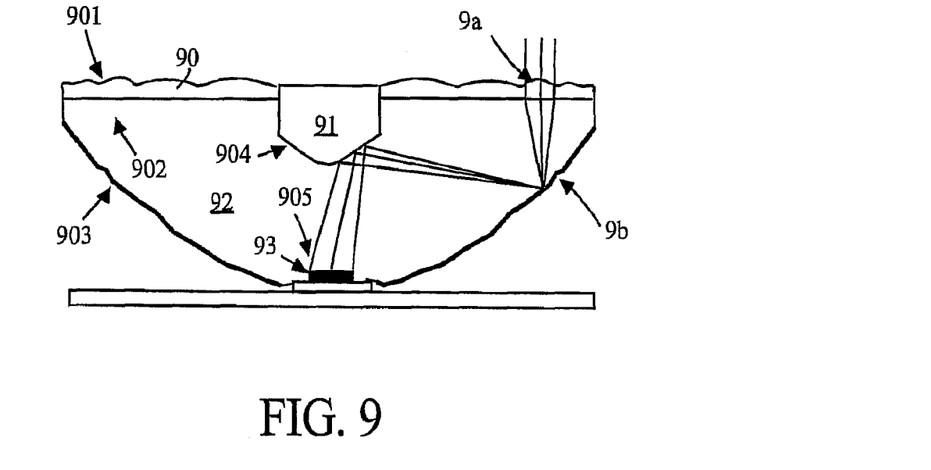
FIG. 9 illustrates a Kohler radial homogenizer optical system that may be comprised of volumes of different refractive indices and the Kohler radial homogenization is done between the entry surface and the primary mirror.

FIG. 9 illustrates a Kohler radial homogenizer optical system that can be composed of volumes 90, 91, 92 and 93 of different refractive indices; and the Kohler radial homogenization is done between the entry surface 901 and the primary mirror 903. In this case, the focal length and pitch of the lens and mirror segment will decrease from the optical axis to the rim, due to the progressively smaller separation of the Kohler integrator pairs.

Figure 10:
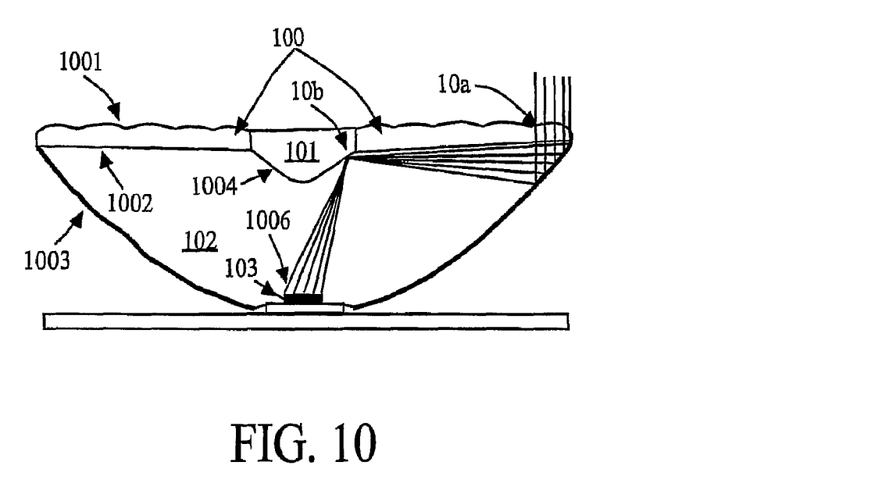
FIG. 10 illustrates a Kohler radial homogenizer optical system that may be comprised of volumes of different refractive indices and the Kohler radial homogenization is done between the entry surface and the secondary mirror.

FIG. 10 illustrates a Kohler radial homogenizer optical system that is comprised of volumes 100, 101, 102 and 103 of different refractive indices; and the Kohler radial homogenization is done between the entry surface 1001 and the secondary mirror 1004. In one embodiment, material 101 is air and dielectric material materials 100 and 102 are identical (so interface 1002 does not exist), so it can be manufactured as a single piece.

Figure 11:
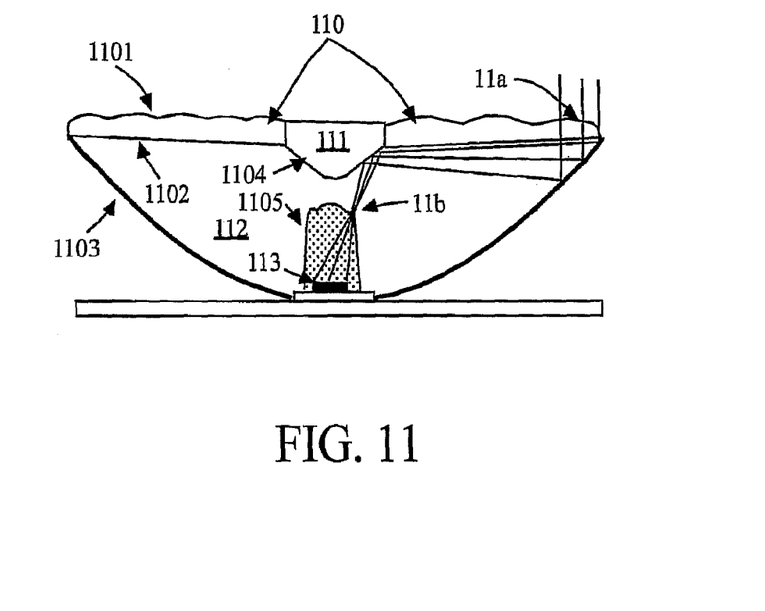
FIG. 11 illustrates a Kohler radial homogenizer optical system that may be comprised of volumes of different refractive indices and the Kohler radial homogenization is done between the entry surface and the exit surface.

FIG. 11 illustrates a Kohler radial homogenizer optical system that is comprised of volumes 110, 111, 112 and 113 of different refractive indices and the Kohler radial homogenization is done between the entry surface 1101 and the exit surface 1105. In one embodiment, the material 112 is air, so the lens segments of exit surface 1105 are concave. In another embodiment, the material 112 is a dielectric and 113 is air, so the lens segments of exit surface 1105 are convex.

Figure 12:
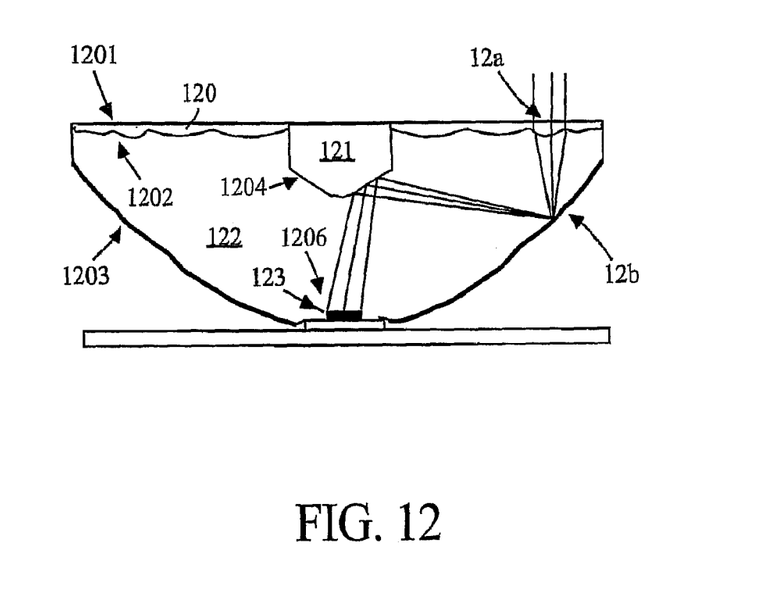
FIG. 12 illustrates a Kohler radial homogenizer optical system that may be comprised of volumes of different refractive indices and the Kohler radial homogenization is done between the inner surface of the top cover and the primary mirror.

FIG. 12 illustrates a Kohler radial homogenizer optical system that is comprised of volumes 120, 121, 122 and 123 of different refractive indices; and the Kohler radial homogenization is done between the inner surface 1202 of the top cover and the primary mirror 1203. Also in this case, the focal length and pitch of the lens and mirror segment will decrease from the optical axis to the rim, due to the progressively smaller separation of the Kohler integrator pairs.

Figure 13:
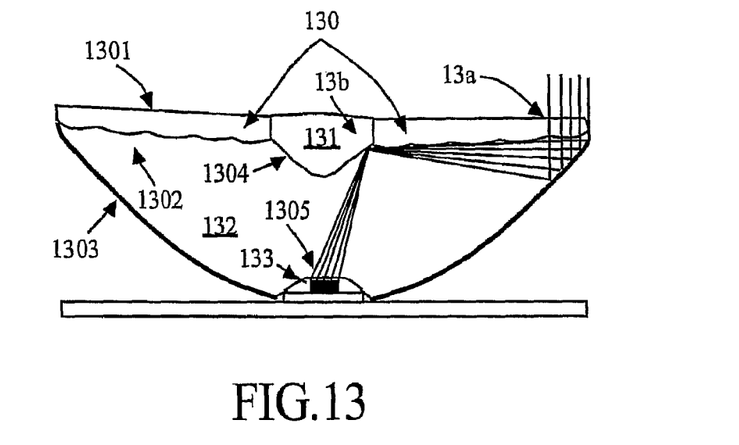
FIG. 13 illustrates a Kohler radial homogenizer optical system that may be comprised of volumes of different refractive indices and the Kohler radial homogenization is done between the inner surface of the top cover and the secondary mirror.

FIG. 13 illustrates a Kohler radial homogenizer optical system that is comprised of volumes 130, 131, 132 and 133 of different refractive indices; and the Kohler radial homogenization is done between the inner surface of the top cover 1302 and the secondary mirror 1304. In one embodiment, material 1301 is air and dielectric material materials 1300 and 1302 are identical (so interface 1002 does not exist), so that it can be manufactured as a single piece.

Figure 14:
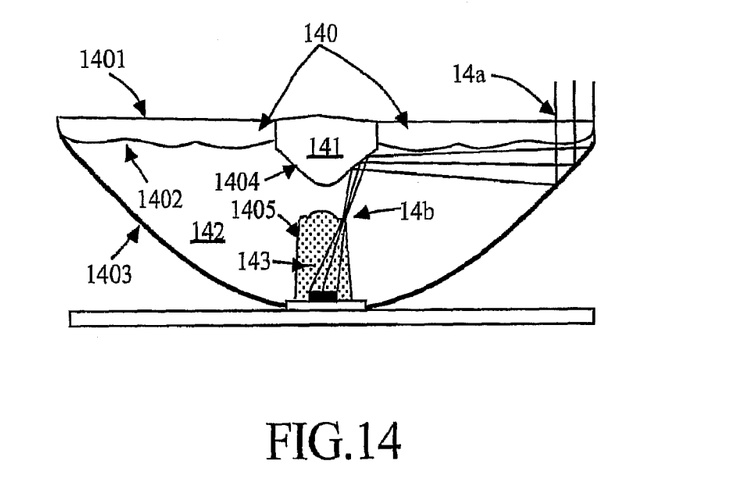
FIG. 14 illustrates a Kohler radial homogenizer optical system that may be comprised of volumes of different refractive indices and the Kohler radial homogenization is done between the inner surface of the top cover and the exit surface.

FIG. 14 illustrates a Kohler radial homogenizer optical system that is comprised of volumes 140, 141, 142 and 143 of different refractive indices; and the Kohler radial homogenization is done between the inner surface of the top cover 1402 and the exit surface 1405. In one embodiment, material 141 is air and dielectric material materials 140 and 142 are identical (so interface 1402 does not exist), so that it can be manufactured as a single piece. In one embodiment, the material 112 is air, so the lens segments of exit surface 1405 are concave. In another embodiment, the material 142 is a dielectric and 143 is air, so the lens segments of exit surface 1405 are convex.

The use of the inner surface instead of outer surface of the cover (for example, 1202 in FIG. 12 instead of 901 in FIG. 9) to allocate the Kohler integrator segments is beneficial in case the system is used outdoors (as it is usually the case in photovoltaic applications), because the slope discontinuities between segments in top surface will accumulate dust and thus will need a higher cleaning maintenance.

Figure 15:
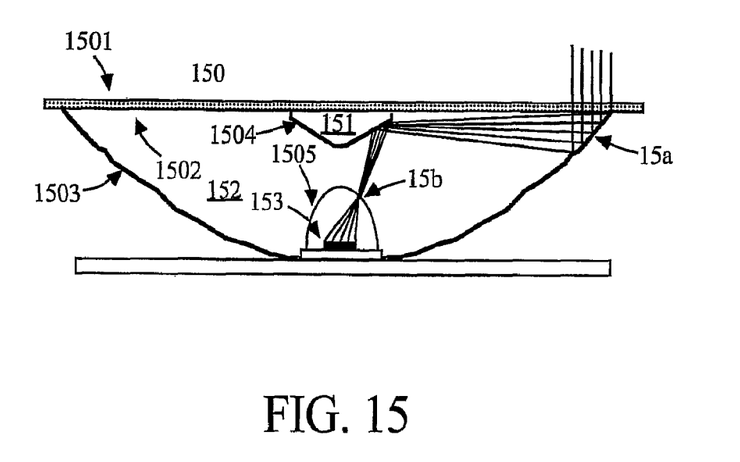
FIG. 15 illustrates a Kohler radial homogenizer optical system that may be comprised of volumes of different refractive indices and the Kohler radial homogenization is done between the primary mirror and the exit surface.

FIG. 15 illustrates a Kohler radial homogenizer optical system that is comprised of volumes 150, 151, 152 and 153 of different refractive indices; and the Kohler radial homogenization is done between the primary mirror 1503 and the exit surface 1505. In one embodiment, the material 152 is air, so the lens segments of exit surface 1505 are concave. In another embodiment, the material 152 is a dielectric and 153 is air, so the lens segments of exit surface 1505 are convex.

Figure 16:
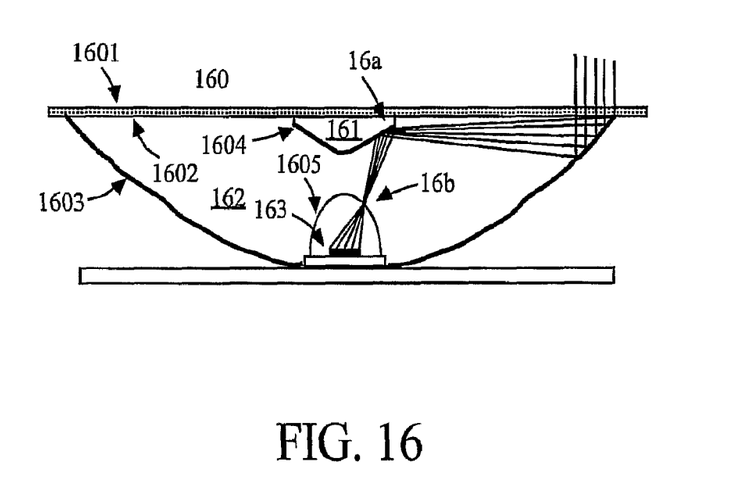
FIG. 16 illustrates a Kohler radial homogenizer optical system that may be comprised of volumes of different refractive indices and the Kohler radial homogenization is done between the secondary mirror and the exit surface.
Figure 17A:
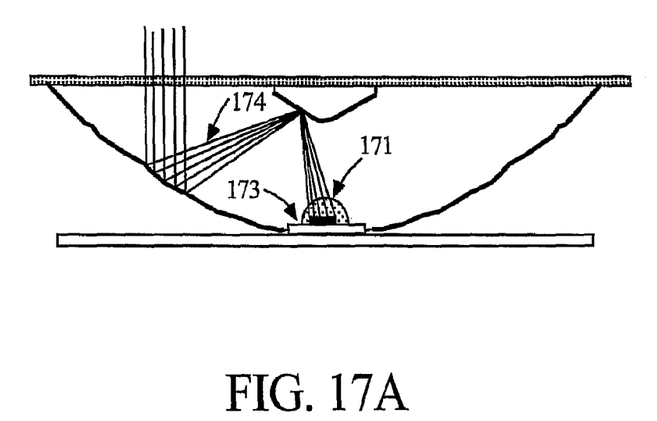
FIG. 17 illustrates the shaping of the exit surface to improve the uniformity of the system when the sun is on axis
Figure 17B:
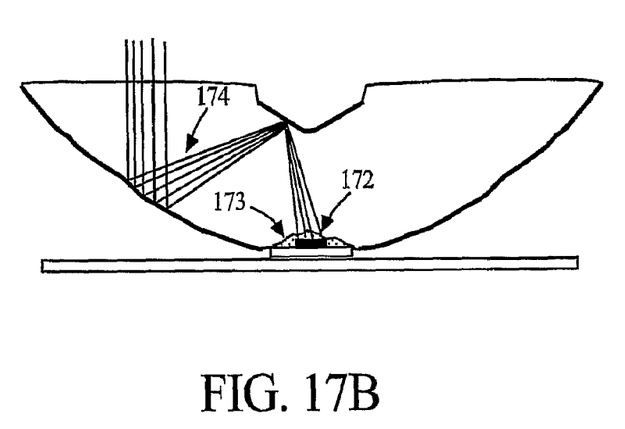

FIG. 16 illustrates a Kohler radial homogenizer optical system that is comprised of volumes 160, 161, 162 and 163 of different refractive indices; and the Kohler radial homogenization is done between the secondary mirror 1604 and the exit surface 1605. In one embodiment, the material 162 is air, so the lens segments of exit surface 1605 are concave. In another embodiment, the material 162 is a dielectric and 163 is air, so the lens segments of exit surface 1605 are convex. When the exit surface is to be selected, it is possible to shape it to improve even more the uniformity of the Kohler homogenizing device when the sun is on-axis, provided that there is a significant refractive index difference at both sides of the exit surface. FIGS. 17A & B illustrates how to provide the uniformity-improvement: the exit surface profile should have a concavity 171 or a convexity 172 at the center, when the cell side 173 has a higher or lower refractive index, respectively. This profiles cause the rays 174 going to the cell-center to be deflected closer to the cell edge.

It should be understood that various changes and modifications referred to in the embodiment described herein would be apparent to those skilled in the art. Such changes and modification can be made without departing from the spirit and scope of the present invention.

The invention claimed is:

1. A rotational symmetric dual-reflector solar concentrator employing Kohler integration to homogenize the illumination on the target, comprising:

a plurality of optically active surfaces including a concave primary reflector and a secondary reflector;

said concave primary reflector with an aim-direction directed toward the sun, thereby defining an upward direction, said primary reflector receiving optical radiation therefrom in a far-field angle bounded within an angle of solar-ray acceptance about said aim-direction, said primary reflector redirecting said radiation upward and centrally, said central redirection by said primary reflector generating flux concentration;

said secondary reflector positioned coaxial with said primary reflector to receive said redirected radiation;

said secondary reflector being smaller than said primary reflector and accepting said redirected solar radiation therefrom;

said secondary reflector redirecting said solar radiation downward and centrally, said central redirection by said secondary reflector generating solar radiation concentration;

a central target zone receiving said concentrated solar radiation;

said primary and secondary reflector shaped so that when the sun is within said angle of acceptance the solar radiation is directed to said target zone; and said plurality of optically active surfaces comprising a first and second Kohler surfaces, wherein cross sections of said first and second Kohler surfaces both further comprise a multiplicity of discrete curved segments subdividing said cross sections, said subdivision establishing a correspondence between pairs of segments of said first and second Kohler surfaces, each of said segments of said first Kohler surface such as to image said angle of acceptance onto said corresponding segment of said second Kohler surface, said corresponding segment of said second Kohler surface such as to image said corresponding segment of said first Kohler surface onto said target zone.

2. The solar concentrator of claim 1 wherein said target zone is disposed in the vicinity of a vertex of said primary reflector.

3. The solar concentrator of claim 1 wherein said angle of acceptance is less than four degrees from said aim-direction.

4. The solar concentrator of claim 1 further comprising a central aperture formed in said primary reflector, said aperture allowing passage therethrough of said concentrated solar radiation onto said target zone, said target zone positioned below a vertex of said primary mirror.

5. The solar concentrator of claim 1 wherein said primary and secondary reflectors are separated by a distance comprising air within the distance and between the primary and secondary reflectors.

6. The solar concentrator of claim 5 further comprising a dielectric lens positioned aligned with said target zone.

7. The solar concentrator of claim 5 further comprising a central aperture formed in said primary reflector, said aperture allowing passage therethrough of said concentrated solar radiation onto said target zone, and a transparent cover disposed over the central aperture of said primary reflector.

8. The solar concentrator of claim 7 wherein said transparent cover supports said secondary reflector.

9. The solar concentrator of claim 1 further comprising at least one optically transparent dielectric media between said primary reflector and said secondary reflector and between said secondary reflector and said target zone.

10. The solar concentrator of claim 1 further comprising at least one photovoltaic cell disposed within said central target zone so as to receive at least a portion of the concentrated solar radiation and convert at least the portion of said concentrated solar radiation into electricity.

11. A rotational symmetric dual-reflector solar concentrator employing Kohler integration to homogenize the illumination on the target, comprising:
a refractive first surface of a transparent dielectric material, said first surface oriented to receive solar radiation in air;
a refractive second surface receiving said radiation from said first surface,
a concave primary reflector having an aim-direction directed toward the sun, thereby defining an upward direction, said first and second surfaces positioned upward of said primary reflector, said primary reflector receiving radiation therefrom in a far-field angle of acceptance of solar rays, said angle bounded within an angle of solar-ray acceptance about said aim-direction, said primary reflector redirecting said radiation upward and centrally, said central redirection by said primary reflector generating solar concentration;
a secondary reflector positioned above said primary reflector and coaxial therewith; said secondary reflector being smaller than said primary reflector and accepting said redirected solar radiation therefrom; said secondary reflector redirecting said solar radiation downward and centrally, said central redirection by said secondary reflector generating solar concentration;
a refractive exit surface receiving said concentrated solar rays and passing them therethrough;
a central target zone receiving said concentrated solar rays from said exit surface; and
where said first and second refractive surfaces and said primary reflector and said secondary reflector and said exit surface being five successive surfaces, said five surfaces shaped to act so when the sun is within said angle of acceptance the solar radiation is directed to said target zone,
where three of said five surfaces are fixed and the remaining two are designable and designated as first and second designable surfaces;
where each of said designable surfaces comprises segmentation that subdivides a cross section of said first and second designable surfaces into corresponding pairs of discrete segments, said subdivision establishing a correspondence between pairs of segments of the cross sections of said first and second designable surfaces, each of said segments of said first designable surface such as to image said angle of acceptance onto said corresponding segment of said second designable surface, said corresponding segment of said second designable surface such as to image said corresponding segment of said first designable surface onto said target zone.

12. The solar concentrator of claim 11 wherein said target zone is disposed proximate to a vertex of said primary reflector.

13. The solar concentrator of claim 11 wherein said angle of acceptance comprises all rays less than four degrees from said aim-direction.

14. The solar concentrator of claim 11 further comprising a central aperture defined within said primary reflector, said aperture allowing passage therethrough of said concentrated rays onto said target zone, said target zone positioned below a vertex of said primary mirror.

15. The solar concentrator of claim 11 further comprising at least one photovoltaic cell disposed within said central target zone so as to receive at least a portion of the concentrated solar radiation and convert at least the portion of said concentrated solar rays into electricity.

16. The solar concentrator of claim 11 wherein said first designable surface is said refractive first surface and said second designable surface is said refractive second surface.

17. The solar concentrator of claim 11 wherein said first designable surface is said refractive first surface and said second designable surface is said primary reflector.

18. The solar concentrator of claim 11 wherein said first designable surface is said refractive first surface and said second designable surface is said secondary reflector.

19. The solar concentrator of claim 11 wherein said first designable surface is said refractive first surface and said second designable surface is said refractive exit surface.

20. The solar concentrator of claim 11 wherein said first designable surface is said refractive second surface and said second designable surface is said primary reflector.

21. The solar concentrator of claim 11 wherein said first designable surface is said refractive second surface and said second designable surface is said secondary reflector.

22. The solar concentrator of claim 11 wherein said first designable surface is said refractive second surface and said second designable surface is said refractive exit surface.

23. The solar concentrator of claim 11 wherein said first designable surface is said primary reflector and said second designable surface is said refractive exit surface.

24. The solar concentrator of claim 11 wherein said first designable surface is said secondary reflector and said second designable surface is said refractive exit surface.

25. The solar concentrator of claim 11 wherein said first designable surface is said primary reflector and said second designable surface is said secondary reflector.

26. The solar concentrator of claim 25 wherein said refractive exit surface has a central convexity.

27. The solar concentrator of claim 25 wherein said refractive exit surface has a central concavity.

* * * * *